(12) United States Patent
Takeuchi et al.

(10) Patent No.: US 7,488,667 B2
(45) Date of Patent: Feb. 10, 2009

(54) METHOD FOR MANUFACTURING NITRIDE-BASE SEMICONDUCTOR ELEMENT AND NITRIDE-BASE SEMICONDUCTOR ELEMENT

(75) Inventors: Kunio Takeuchi, Joyo (JP); Yasumitsu Kunoh, Hirakata (JP)

(73) Assignee: Sanyo Electric Co., Ltd., Moriguchi-Shi (JP)

( * ) Notice: Subject to any disclaimer, the term of this patent is extended or adjusted under 35 U.S.C. 154(b) by 0 days.

(21) Appl. No.: 11/356,964

(22) Filed: Feb. 21, 2006

(65) Prior Publication Data

US 2006/0194360 A1    Aug. 31, 2006

(30) Foreign Application Priority Data

Feb. 22, 2005    (JP)    ............................. 2005-045886

(51) Int. Cl.
 *H01L 21/30* (2006.01)
(52) U.S. Cl. .................. 438/455; 438/457; 438/458; 438/761; 438/768; 257/190; 257/633; 257/E21.222
(58) Field of Classification Search ................ 438/455, 438/457, 458, 761, 766; 257/190, 633, E21.122; 428/620, 457
 See application file for complete search history.

(56) References Cited

U.S. PATENT DOCUMENTS 6,756,285 B1 * 6/2004 Moriceau et al. ............ 438/455
2002/0031862 A1 * 3/2002 Ohsawa et al. .............. 438/112
2003/0223138 A1 * 12/2003 Akiyama ..................... 359/883
2004/0014297 A1 * 1/2004 Wu et al. ..................... 438/455
2004/0113270 A1 * 6/2004 Hedler et al. ................ 257/729
2005/0076830 A1 * 4/2005 Motoki et al. ................. 117/92
2005/0215010 A1 * 9/2005 Henninger et al. .......... 438/259
2005/0227453 A1 * 10/2005 Miki et al. ................... 438/438
2005/0282306 A1 * 12/2005 Yamanaka ..................... 438/57
2006/0022592 A1 * 2/2006 Boroson ...................... 313/512
2006/0028773 A1 * 2/2006 Shimazawa et al. ....... 360/324.1
2007/0128830 A1 * 6/2007 Xie ............................. 438/458

FOREIGN PATENT DOCUMENTS

JP    2000-101139    4/2000
JP    2004-266240    9/2004

* cited by examiner

*Primary Examiner*—Fernando L Toledo
*Assistant Examiner*—Jae Lee
(74) *Attorney, Agent, or Firm*—Marvin A. Motsenbocker; Mots Law, PLLC

(57) ABSTRACT

A principal surface at one side of a support substrate has thereon an adjustment layer made of material having a higher thermal expansion coefficient than that of the support substrate. Then, a nitride-base semiconductor element layer and the support substrate on a growth substrate are joined via an adhesion layer. Next, the support substrate is joined to the nitride-base semiconductor element layer via the adhesion layer. Next, the growth substrate is separated from the joined nitride-base semiconductor element layer and the support substrate.

20 Claims, 11 Drawing Sheets

US 7,488,667 B2

METHOD FOR MANUFACTURING NITRIDE-BASE SEMICONDUCTOR ELEMENT AND NITRIDE-BASE SEMICONDUCTOR ELEMENT

CROSS REFERENCE TO RELATED APPLICATIONS

This application is based upon and claims the benefit of priority from prior Japanese Patent Application P2005-045886 filed on Feb. 22, 2005; the entire contents of which are incorporated by reference herein.

BACKGROUND OF THE INVENTION

1. Field of the Invention

The present invention relates to a method for manufacturing a nitride-base semiconductor element and a nitride-base semiconductor element.

2. Description of the Related Art

Recently, nitride-base compound semiconductors (e.g., GaN, InN, AlN) have been frequently used as materials for light-emitting elements (e.g., blue and green light-emitting diodes (LED), blue-violet semiconductor laser) and electronic devices (e.g., high-speed transistors that can be operated with a high temperature). This nitride-base semiconductor is generally formed on a growth substrate of sapphire or SiC by the heteroepitaxial growth method because the manufacture of bulk single crystals is difficult.

However, sapphire, which is insulating material, has caused a problem in which p and n electrodes must be formed on a single surface to reduce the number of elements that can be obtained from a wafer having the same diameter, to reduce an effective light emitting area in a single area of an element, and to cause difficulty in cleavage in order to prepare cavity facets required for laser. Furthermore, a sapphire substrate has a thermal conductivity of 42 W/m·k that is lower than a thermal conductivity of 130 W/m·k of GaN. Thus, a nitride semiconductor element formed on the sapphire substrate had a poor heat radiation performance.

To solve this, a method has been suggested by which a surface of a nitride-base semiconductor element layer is joined with a support substrate by thermocompression or the like to separate a growth substrate of sapphire or the like from the support substrate and the nitride-base semiconductor element layer. Such separation methods have been disclosed, for example, by a method for polishing a growth substrate to separate a nitride-base semiconductor element substrate (see Japanese Patent Unexamined Publication No. 2004-266240 for example) and a method for emitting laser light from a back face of a growth substrate to separate the growth substrate (see Japanese Patent Unexamined Publication No. 2000-101139 for example).

However, the separation method by polishing as described above provides a poor throughput and may cause an abnormal crack in the polishing and thus the reuse of a growth substrate is difficult. The separation method by laser emission as described above on the other hand needs to appropriately maintain a laser light wavelength and a band gap between a nitride-base semiconductor element layer and a growth substrate. Thus, this method is not versatile to different types of growth substrates and thus requires laser apparatuses having appropriate wavelengths respectively, which is not economic.

SUMMARY OF THE INVENTION

A first aspect of the present invention is to provide a method for manufacturing a nitride-base semiconductor element, including: a) forming, on a first substrate, a nitride-base semiconductor element layer having at least one layer; b) forming, on one principal surface of a second substrate, an adjustment layer made of material having a higher thermal expansion coefficient than that of the second substrate; c) joining the other principal surface of the second substrate on the nitride-base semiconductor element layer via a adhesion layer; and, d) separating the first substrate from the joined nitride-base semiconductor element layer and the second substrate.

A second aspect of the present invention is to provide a nitride-base semiconductor element that is manufactured by: forming, on a first substrate, a nitride-base semiconductor element layer having at least one layer; joining one principal surface of the second substrate on the nitride-base semiconductor element layer via a adhesion layer; and separating the first substrate from the joined nitride-base semiconductor element layer and the second substrate, the nitride-base semiconductor element, comprising: a) an adjustment layer that is provided on the other principal surface of the second substrate and that is made of material having a different thermal expansion coefficient from that of the second substrate.

DETAILED DESCRIPTION OF THE INVENTION

Figure 1A:
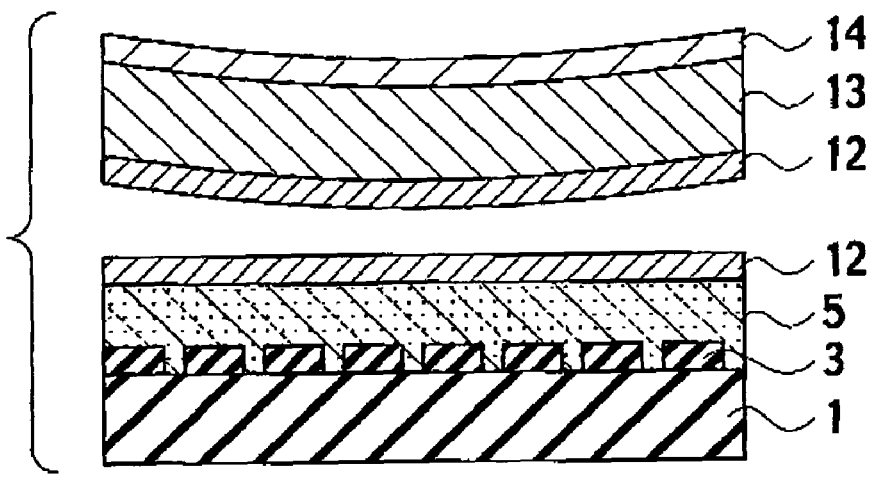
FIGS. 1A, 1B and 1C are a cross-sectional view schematically illustrating nitride-base semiconductor elements according to the first and second embodiments.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First, an outline of the first and second embodiments of the present invention will be described with reference to FIG. 1.

As shown in FIG. 1A, a principal surface at one side of a support substrate 13 in the first and second embodiments has thereon an adjustment layer 14 made of material having a higher thermal expansion coefficient than that of the support substrate 13. Then, a nitride-base semiconductor element layer 5 and the support substrate 13 on a growth substrate 1 are joined via an adhesion layer 12. The nitride-base semiconductor element layer 5 includes mask layers 3 among which openings are provided with a predetermined interval. By providing the adjustment layer 14 made of material having a higher thermal expansion coefficient than that of the support substrate 13 as described above, the support substrate 13 is convexly curved toward the nitride-base semiconductor element layer 5.

Figure 1B:
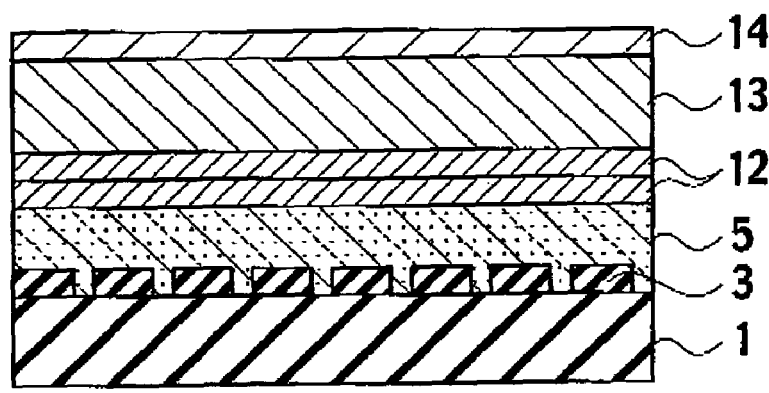

Next, as shown in FIG. 1B, the support substrate 13 is joined to the nitride-base semiconductor element layer 5 via the adhesion layer 12.

Figure 1C:
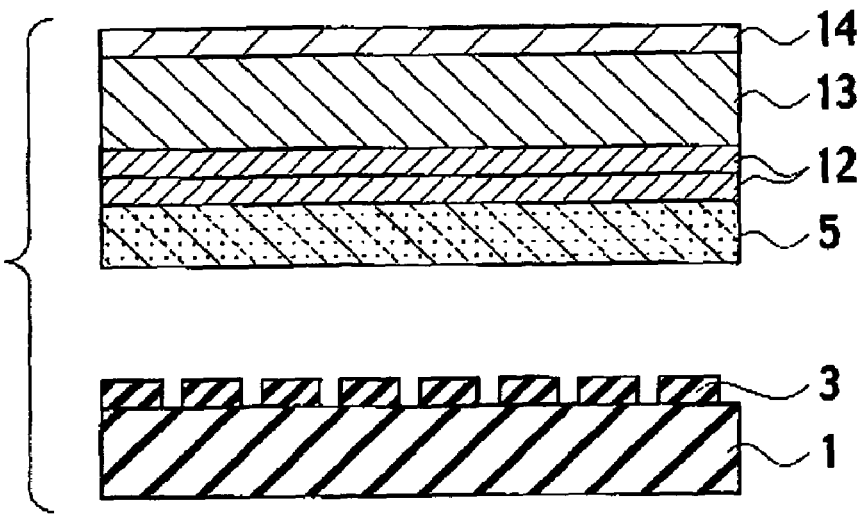

Next, a growth substrate 1 is separated from the joined nitride-base semiconductor element layer 5 and the support substrate 13 as shown in FIG. 1C. Then, the support substrate 13 is convexly curved toward the nitride-base semiconductor element layer 5 and the mask layers 3 is provided thus enabling an easy peeling in the vicinity of the upper and lower parts of an interface of the mask layer 3.

FIRST EMBODIMENT

Figure 2A:
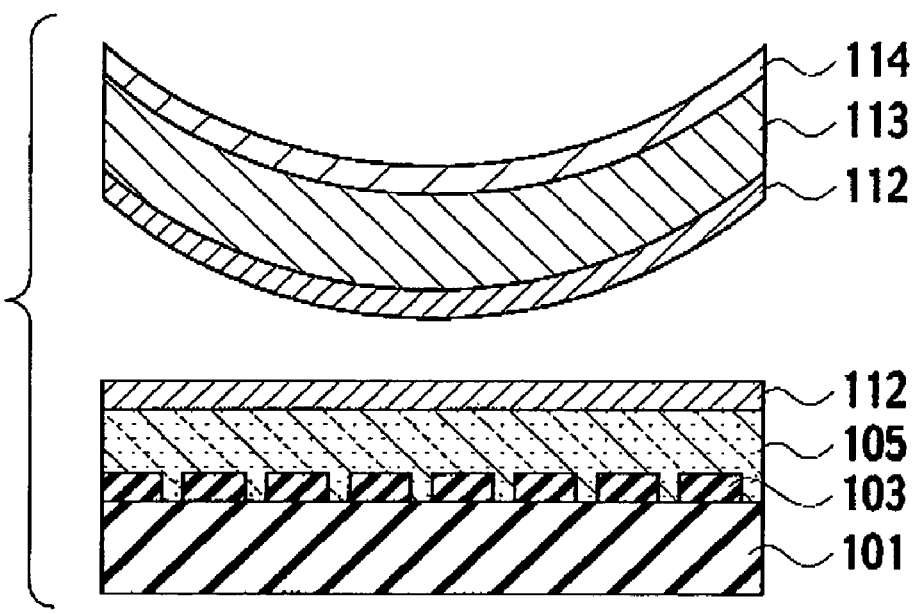
FIGS. 2A and 2B are a cross-sectional view schematically illustrating the nitride-base semiconductor element according to the first embodiment.
Figure 2B:
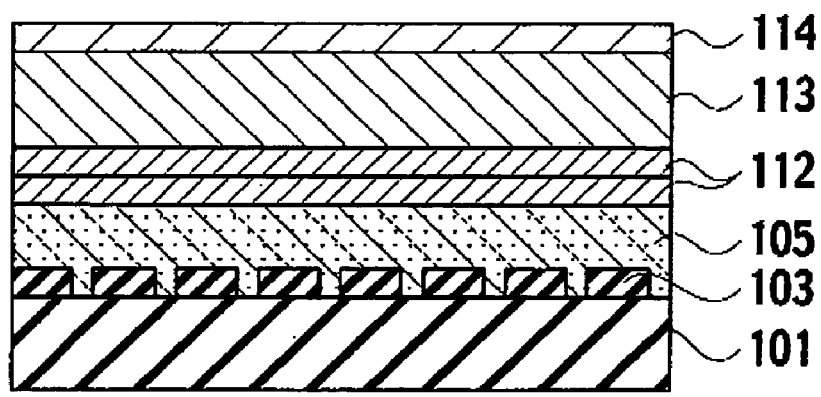

FIGS. 2A and 2B are a cross-sectional view schematically illustrating a method for manufacturing the nitride-base semiconductor element according to the first embodiment. In the first embodiment, an adjustment layer 114 made of material having a higher thermal expansion coefficient than that of a support substrate 113 is formed on one of principal surfaces of the support substrate 113, as shown in FIG. 2A. Then, a nitride-base semiconductor element layer 105 and a support substrate 113 on a GaN substrate 101 are joined via an adhesion layer 112. The nitride-base semiconductor element layer 105 includes mask layers 103 among which openings are provided with a predetermined interval. By providing the adjustment layer 114 made of material having a higher thermal expansion coefficient than that of the support substrate 113 as described above, the support substrate 113 is convexly curved toward the nitride-base semiconductor element layer 105. On the other hand, the GaN substrate 101 has an almost flat surface or is concavely curved toward the nitride-base semiconductor element layer 105. Then, the support substrate 113 and the nitride-base semiconductor element layer 105 are joined via the adhesion layer 112 as shown in FIG. 2B.

Next, the method for manufacturing the nitride-base semiconductor laser according to the first embodiment will be described with reference to FIGS. 3 to 5.

Figure 3A:
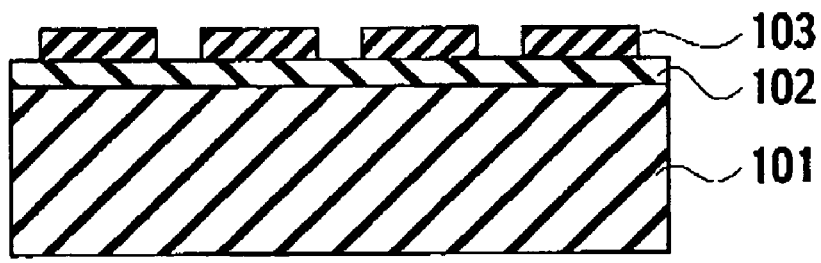
FIGS. 3A, 3B and 3C are a cross-sectional view for explaining a method for manufacturing the nitride-base semiconductor element according to the first embodiment (No. 1).

First, as shown in FIG. 3A, the Metal Organic Chemical Vapor Deposition (MOCVD) method is used to grow a buffer layer 102 consisting of GaN of undoped non-single crystals on a surface of the GaN substrate 101 (0001).

Next, the mask layers 103 made of dielectric material such as $SiO_2$ are patterned to have stripe geometry and are then grown in the lateral direction from parts at which the mask layers 103 are exposed on the buffer layer 102. In this manner, the mask layers 103 having openings with a predetermined interval are formed.

Figure 7A:
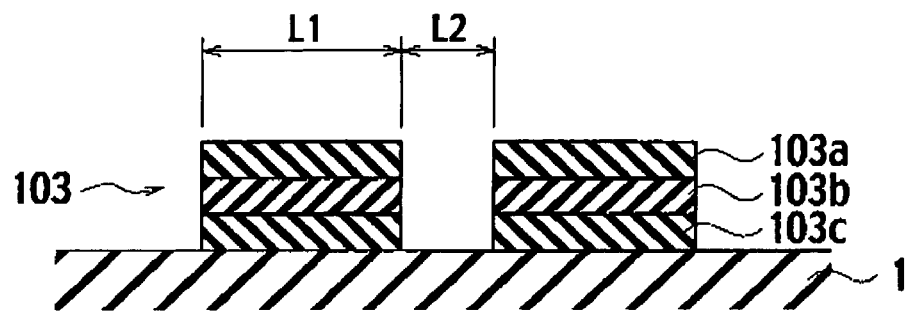
FIGS. 7A and 7B illustrate mask layers according to the first and second embodiments.
Figure 7B:
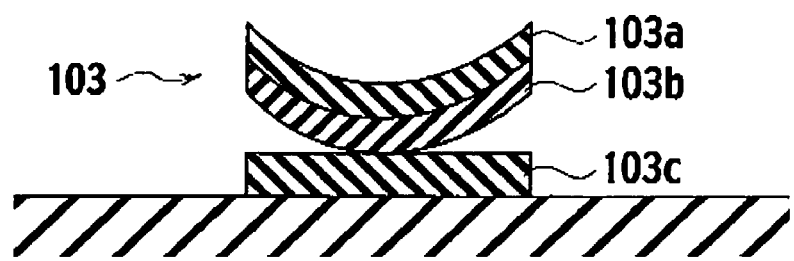

FIGS. 7A and 7B are an expansion view of the mask layers 103. As shown in FIG. 7A, the mask layers 103 have openings each of which extends in a lateral length L2 of the cross section and is grown to have a lateral length L1 of the cross section. Alternatively, the mask layer 103 also may have another structure in which, in order to allow the mask layer 103 to function as a peeling layer in the separation step, a plurality of dielectric material films and metal films having different thermal expansion coefficients are layered. For example, the mask layer 103 also may be formed by a $Si_3N_4$ layer 103a, a metal layer 103b such as Si, Ti, or Ni, and a $SiO_2$ layer 103c. Alternatively, the mask layer 103 also may be provided by forming Ti for example having a thickness of a few nm to subsequently grow again the mask layer 103 by the electronic beam evaporation or the like. As shown in FIG. 7B, in the mask layer 103, a plurality of layers having different thermal expansion coefficients are layered so that some of the layers are curved and are peeled from the rest. In FIG. 7B, the layer 103a and the layer 103b are convexly curved toward the layer 103c and thus the layer 103b can be peeled from the layer 103c. Layers forming the mask layer 103 preferably include material that has a higher thermal expansion coefficient than that of the buffer layer 102 and that includes Si and Ti.

Figure 3B:
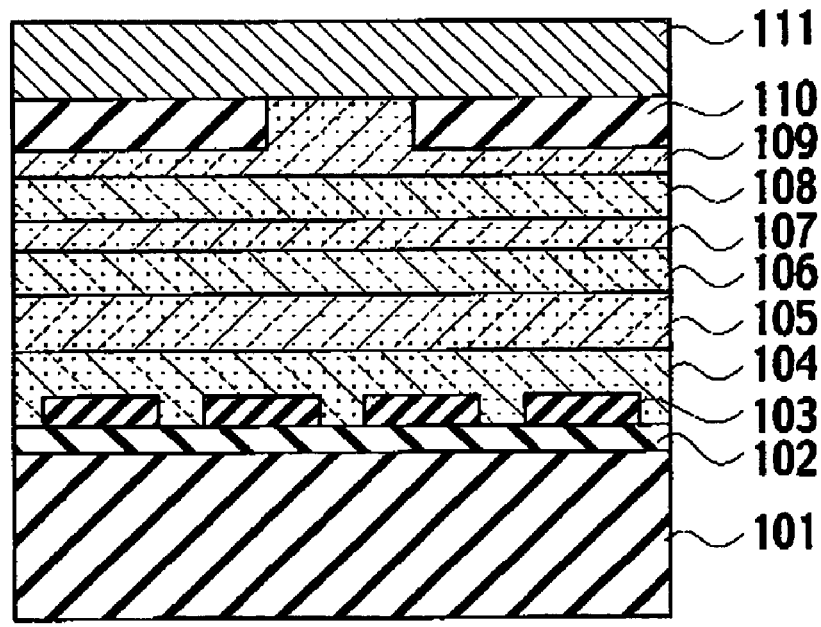

Next, as shown in FIG. 3B, a base layer 104 is grown on the buffer layer 102 and the mask layer 103. The base layer 104 has a thickness of about 5 μm and is made of undoped single crystal GaN. Next, a n-type contact layer 105 is grown on the base layer 104. The n-type contact layer 105 has a thickness of about 5 to 100 μm and is made of single crystal GaN doped with Si. Next, an n-type clad layer 106 is grown on the n-type contact layer 105. The n-type clad layer 106 has a thickness of about 1.0 μm and is made of single crystal $Al0.07Ga0.93N$ doped with Ge.

Figure 3C:
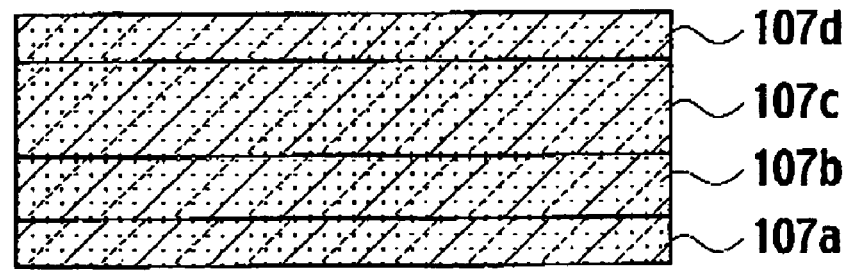

Next, a light-emitting layer 107 is grown on the n-type clad layer 106. As shown in FIG. 3C, this light-emitting layer 107 is composed of an n-side carrier blocking layer 107a; a multiquantum well (QW) active layer 107b; a p-side light guide layer 107c; and a p-side carrier blocking layer 107d. The n-side carrier blocking layer 107a is formed on the n-type clad layer 106 and is made of undoped single crystal $Al_{0.25}Ga_{0.75}N$ having a thickness of about 20 nm. The MQW active layer 107b is formed on the n-side carrier blocking layer 107a and is provided by alternately layering three well layers that are made of undoped single crystal $In_{0.15}Ga_{0.85}N$ and that have a thickness of about 3.5 nm and three barrier layers that are made of undoped single crystal $In_{0.05}Ga_{0.95}N$ and that have a thickness of about 20 nm. The p-side light guide layer 107c is formed on the MQW active layer 107b and is made of undoped single crystal $In_{0.01}Ga_{0.99}N$ and has a thickness of about 0.1 μm. The p-side carrier blocking layer 107d is formed on the p-side light guide layer 107c and is made of single crystal $Al_{0.25}Ga_{0.75}N$ doped with Mg and has a thickness of about 20 nm.

Next, a p-type clad layer 108 is grown on the light-emitting layer 107. The p-type clad layer 108 is made of single crystal $Al_{0.07}Ga_{0.93}N$ doped with Mg and has a thickness of about 0.5 μm. This p-type clad layer 108 has a convex shape by removing a predetermined region. Next, a p-type contact layer 109 is grown on the p-type clad layer 108. The p-type contact layer 109 is made of single crystal $Ga_{0.99}In_{0.01}N$ doped with Mg and has a thickness of about 3 nm.

Next, a heat treatment or an electron beam processing is used to make the p-type dad layer 108 and the p-type contact layer 109 as the p-type ones. In this manner, a nitride-base semiconductor element layer is provided that is composed of the buffer layer 102, the mask layer 103, the base layer 104, the n-type contact layer 105, the n-type clad layer 106, the light-emitting layer 107, the p-type clad layer 108, and the p-type contact layer 109. This nitride-base semiconductor element layer has a thickness of 150 μm or less.

Thereafter, predetermined regions of the p-type clad layer 108 and the p-type contact layer 109 are removed by the photolithographic technique and the reactive ion etching by chlorine gas to provide a ridge section that has a width of about 1.5 µm and that is composed of convex sections extending in the direction of [1-100] to draw a stripe pattern. Then, the etching depth is controlled so that the convex section of the p-type clad layer 307 has a thickness of about 0.35 µm and a flat section other than the convex section has a thickness of about 0.05 µm.

Next, a current block layer 110 made of a $SiO_2$ layer is provided by using the plasma CVD method to form an $SiO_2$ film having a thickness of about 0.2 µm so that the $SiO_2$ film covers the entire surface of the p-type contact layer 109 to subsequently remove the part of the $SiO_2$ film positioned on the p-type contact layer 109 by the photolithographic technique and the reactive ion etching by $CF_4$ gas.

Next, on the exposed surface of the p-type contact layer 109, a p-type ohmic electrode having a stripe structure is formed that consists of a Pt layer having a thickness of about 1 nm; a Pd layer having a thickness of about 100 nm; an Au layer having a thickness of about 240 nm: and an Ni layer having a thickness of about 240 nm. Furthermore, a p-side electrode 111 is sequentially formed on the surface of the current block layer so as to cover the p-side ohmic electrode by the vacuum evaporation method.

Here, the above-described GaN substrate 101 has an almost flat surface or is concavely curved toward the nitride-base semiconductor element layer 105.

Figure 4A:
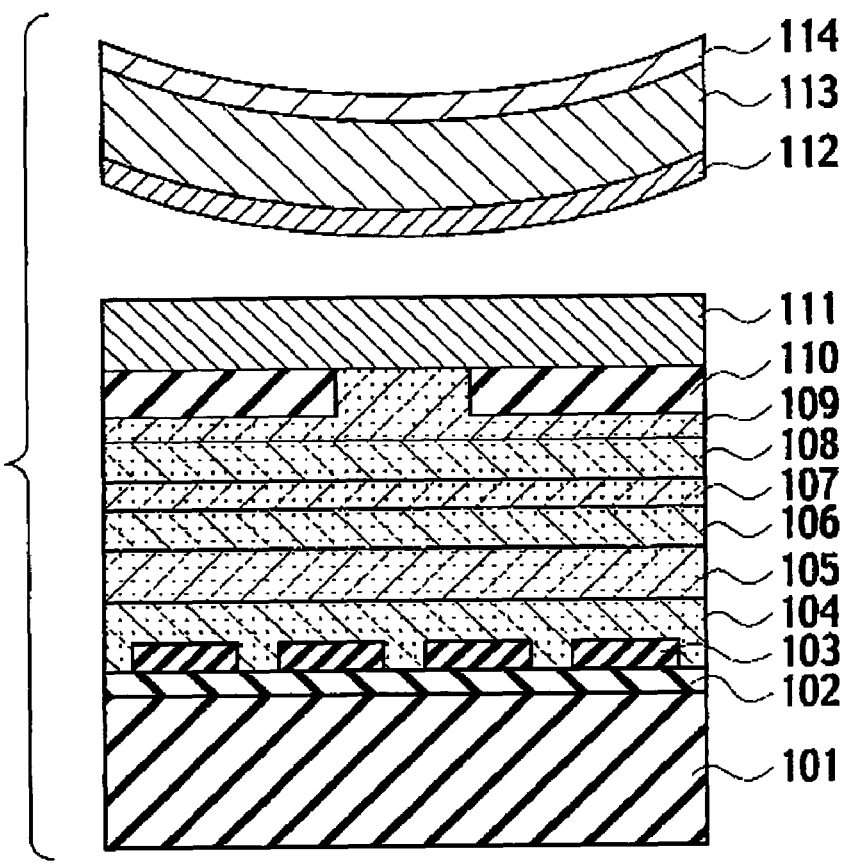
FIGS. 4A and 4B are a cross-sectional view for explaining the method for manufacturing the nitride-base semiconductor element according to the first embodiment (No. 2).

On the other hand, as shown in FIG. 4A, the vacuum evaporation method is used to form an adjustment layer 114 made of Au—Sn (Au: 80 wt %, Sn: 20 wt %) on one principal surface of the support substrate 113 that is made of complex material of Cu and $Cu_2O$ having a good thermal conduction and that has a thickness of about 200 µm. This adjustment layer 114 is made of material having a higher thermal expansion coefficient than that of the support substrate 113. The vacuum evaporation method is used to sequentially form an adhesion layer 112 made of Au—Sn (Au: 80 wt %, Sn: 20 wt %) on the other principal surface of the support substrate 113 via a Ti layer, a Pd layer, and an Au layer. The adjustment layer 114 is preferably made of material such as Au, Sn, Ni, Ti, or the alloy thereof Here, Table 1 shows details of the structures of the support substrate 113, the nitride-base semiconductor element layer, and the GaN substrate 101. It is assumed that the support substrate 113, the nitride-base semiconductor element layer, and the GaN substrate 101 are layered in an order shown in Table 1. The terms "warpage shape" represent a shape of the plate when the plate is curved toward the opposed substrate, respectively. The terms "warpage amount" represent the maximum curvature amount for 15 mm.

TABLE 1

| | Composition | Thickness (µm) | Thermal expansion coefficient (× $10^{-6}$) | Warpage shape/warpage amount |
|---|---|---|---|---|
| Support substrate (Cu—$Cu_2O$) | Au—Sn (80:20 wt %) | 8 | 17.5 | Concave shape 0.5-0.9 µm |
| | Ni plating | 3 | 12.8 | |
| | Cu—$Cu_2O$ (50:50 wt %) | 200 | 9.5 | |
| | Ni plating | 3 | 12.8 | |
| | Ti | 0.03 | 8.9 | |
| | Pd | 0.1 | 11.8 | |
| | Au | 0.2 | 14.1 | |

TABLE 1-continued

| | Composition | Thickness (µm) | Thermal expansion coefficient (× $10^{-6}$) | Warpage shape/warpage amount |
|---|---|---|---|---|
| | Au—Sn (80:20 wt %) | 4 | 17.5 | |
| Nitride-base semiconductor element layer and GaN substrate | Au—Sn (80:20 wt %) | 4 | 17.5 | Flat or concave shape |
| | Au | 0.3 | 14.1 | |
| | Pd | 0.1 | 11.8 | |
| | Ti | 0.2 | 8.9 | |
| | GaN (axis a) | 400 | 5.59 | |

Table 2 shows the relations between the structure and the warpage amount when the support substrate is made of complex material of Cu and $Cu_2O$ and when the support substrate is a Si substrate. Here, the term "top face side" of a vapor deposition surface represents a topside of the substrate in FIG. 4A while the term "back face side" of the vapor deposition surface represents a lower side of the substrate in FIG. 4A. The term "warpage shape" represents a shape curved to each opposed substrate. The term "warpage amount" represents the maximum curvature amount for 15 mm.

TABLE 2

| Support substrate | Vapor deposition surface | Thickness (µm) of Au—Sn (80:20 wt %) | Warpage shape | Warpage amount (µm) |
|---|---|---|---|---|
| Si | Top face side | 3.0 | Concave shape | 3.3 |
| | Back face side | 5.0-6.0 | Convex shape | 5.0-6.0 |
| | Back face side | 4.5 | Convex shape | 8.3-9.0 |
| Cu—Cu2O (50:50 wt %) | Top face side | 4.1-4.9 | Concave shape | 14.0 |
| | Back face side | 6.0-7.0 | Convex shape | 4.5-8.0 |
| | Back face side | 4.5 | Convex shape | 8.0-13.0 |

Figure 6A:
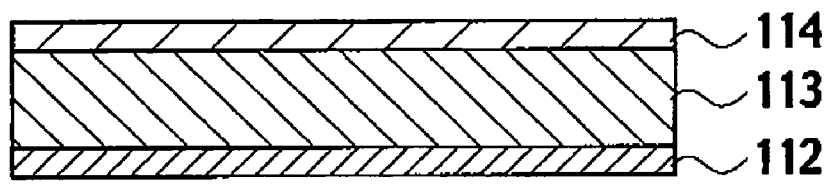
FIGS. 6A, 6B and 6C illustrate support substrates according to the first and second embodiments.
Figure 6B:
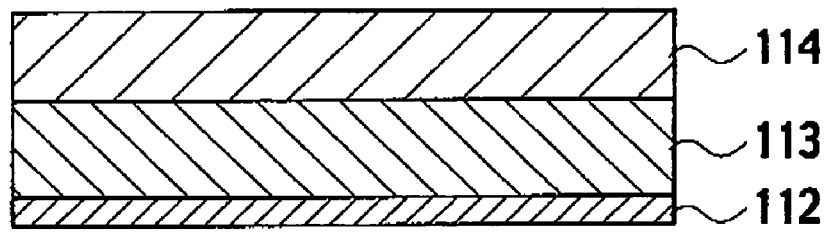
Figure 6C:
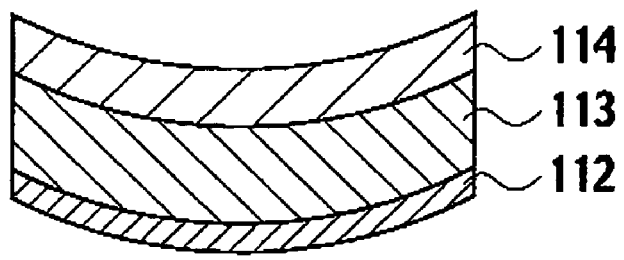

As shown in FIG. 6A, the adjustment layer made of material having a higher thermal expansion coefficient than that of the support substrate 113 (e.g., metal) may be provided on one principal surface of the support substrate 113. Alternatively, the adjustment layer 114 also may be provided as shown in FIG. 6B by the same material as that for the adhesion layer 112 and the adjustment layer 114 may have a higher thickness than that of the adhesion layer 112. In this manner, as shown in FIG. 6C, the support substrate 113 is convexly curved toward the nitride-base semiconductor element layer.

Figure 4B:
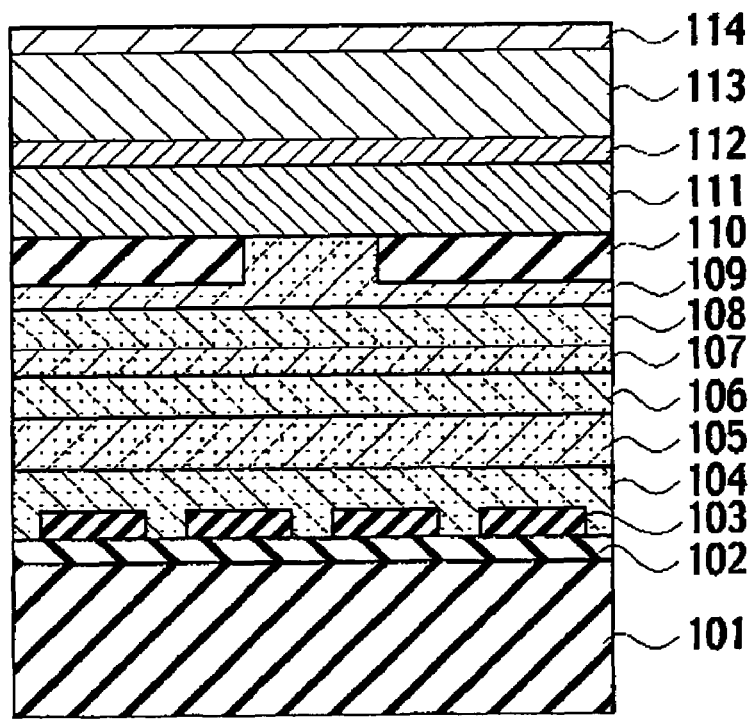

Next, as shown in FIG. 4B, the p-side electrode 111 on the nitride-base semiconductor element layer and the adhesion layer 112 on the support substrate 113 are thermocompressed. The thermocompression is performed in vacuum for about 15 minutes and with about 200 to 300 degrees centigrade for example.

Here, the warpage of the joined substrate is smaller than that before the joint and both substrates are joined via the adhesion layer 112 to generate a tensile stress to the support substrate 113.

Figure 5A:
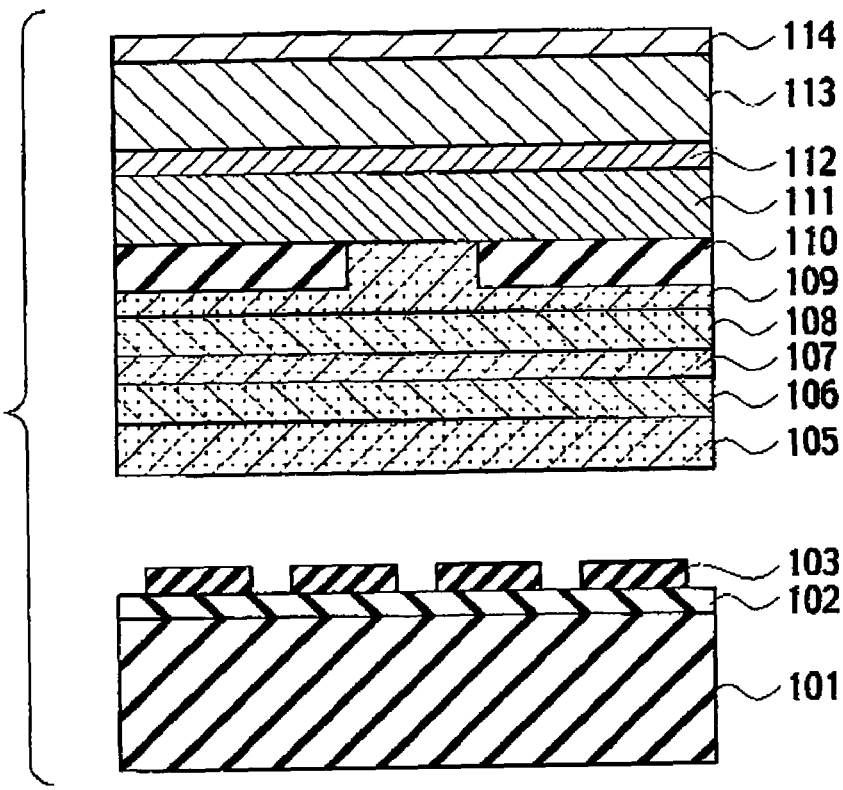
FIGS. 5A and 5B are a cross-sectional view for explaining the method for manufacturing the nitride-base semiconductor element according to the first embodiment (No. 3).

Next, as shown in FIG. 5A, stress is applied to separate the GaN substrate 101 from the nitride-base semiconductor element layer joined with the support substrate 113. A method of applying stress may be, for example, such a method that the joined support substrate 113 is fixed and a jig is abutted to a back side or a lateral side of the GaN substrate 101 for providing a sliding movement to separate the substrate. The sliding direction may be a horizontal or vertical direction to the principal surface of the GaN substrate 101. Furthermore, the heat treatment is performed with a temperature similar to that used in the thermocompression, thereby providing an easy separation.

Next, the n-type contact layer 105 is exposed by polishing or etching.

Figure 5B:
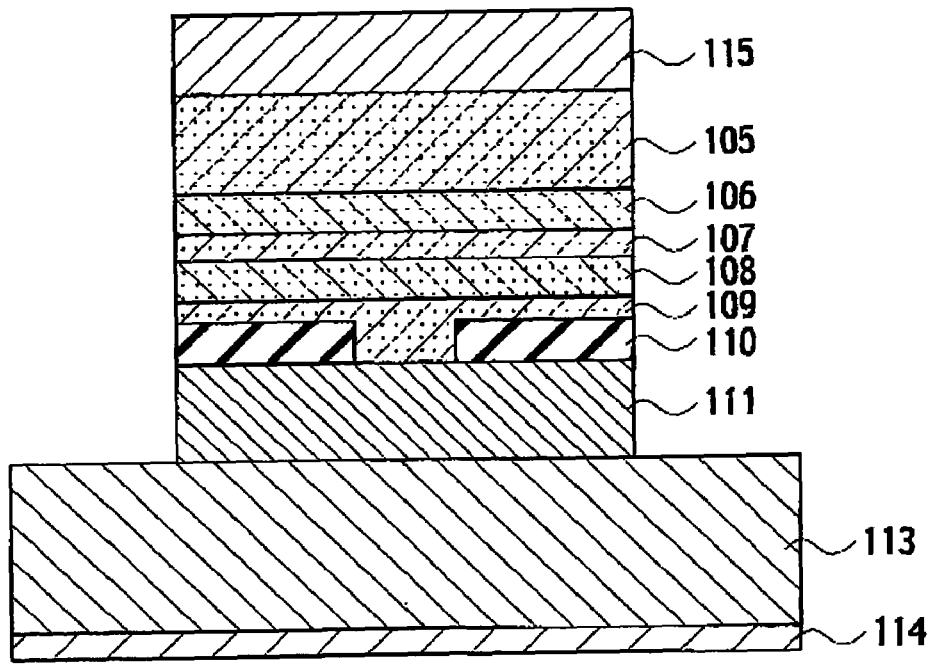

Next, as shown in FIG. 5B, the vacuum evaporation method is used to form an n-side ohmic electrode at a predetermined region on the n-type contact layer 105. The n-side ohmic electrode is composed of: an Al layer having a thickness of about 6 nm; an Si layer having a thickness of about 2 nm; an Ni layer having a thickness of about 10 nm; and an Au layer having a thickness of about 700 nm. Then, an n-side electrode 115 is formed on the n-side ohmic electrode.

Thereafter, a predetermined region other than the n-side electrode 115 is etched by the reactive ion etching using chlorine gas until the support substrate 113 is reached. As a result, laser cavity facets are formed that are composed of the (1-100) face and the (−1100) face orthogonal to the stripe of the ridge. Then, the element is separated by dicing, laser scribing, or a selective etching of the support substrate 113. In this manner, the nitride-base semiconductor laser according to the first embodiment is provided.

According to the method for manufacturing a nitride-base semiconductor element and the nitride-base semiconductor element according to the first embodiment, the adjustment layer 114 is made of material having a higher thermal expansion coefficient than that of the support substrate 113, thus providing a property to the support substrate 113 by which the support substrate 113 is convexly curved toward the nitride-base semiconductor element layer. Thus, the GaN substrate 101 can be separated easily. Furthermore, no damage is caused in the crystals. Thus, even when a film grown on the GaN substrate 101 has a thin thickness, good crystal performance is obtained and the electric and optical characteristic is improved, Furthermore, the GaN film grown on the GaN substrate 101 can be used as a semiconductor element. Thus, crystals having a higher quality than what obtained when a sapphire substrate is used for the growth can be obtained, thus improving the electric and optical characteristic of the semiconductor light-emitting element and extending lifetime.

Furthermore, the radiation characteristic is significantly improved by the element structure in which the laser element is formed with GaN having a thin thickness of about 20 μm and p-ride and n-side electrodes are provided at upper and lower sides of a chip, respectively. Furthermore, a cleavage for forming a laser end face can be provided easily, thereby enabling significant improvement of the oscillation characteristic of the nitride-base semiconductor laser. In addition, the increased contact area can reduce the element resistance to provide high power operation . The current flowing in the upper and lower direction of a chip also can reduce the size of the chip to uniformize the current density to prevent concentrated current, thereby improving the reliability.

Furthermore, the growth substrate (GaN substrate) 101 has small damage by the separation and thus can be reused as a growth substrate. Thus, the growth substrate 101 can be provided with a low cost. Materials for the growth substrate are also not limited to particular material and thus the growth substrate can have versatility. The growth substrate also does not require laser irradiation when being separated and thus a further economic effect can be expected.

Preferably, the adjustment layer 114 is made of the same kind of metal as that of the adhesion layer 112 and the thickness 112 of the adjustment layer 114 is higher than the thickness of the adhesion layer. Alternatively, it is preferable that the support substrate 113 includes compound material of a metal and oxide of the metal as the main component and the adjustment layer 114 is made of gold, tin, nickel, titanium, or alloy of them. Due to this, the support substrate 113 is convexly curved toward the nitride-base semiconductor element layer and thus the growth substrate (GaN substrate) 101 can be separated securely.

Furthermore, it is preferable that one end of the nitride-base semiconductor element layer includes the first electrode and the other end of the nitride-base semiconductor element layer includes the second electrode. This allows the growth substrate (GaN substrate) 101 to be separated easily and electrodes can be provided at upper and lower sides of the nitride-base semiconductor element layer.

The existence of the mask layers 103 having openings with a predetermined interval also provides an easy separation of the GaN substrate 101 in the vicinity of an interface of the mask layer 103. Furthermore, the mask layer 103 is formed to have a structure in which a plurality of thin films having different thermal expansion coefficients (e.g., Ti, Si) are layered. Thus, the GaN substrate can be separated in a further easy manner by being suddenly heated or cooled by Rapid Thermal Anneal (RTA) for example.

The curvature amount of the adjustment layer 114 can be adjusted by adjusting the metal film material, the layering, or the thickness depending on the type of the support substrate 113. The curvature amount also can be effectively adjusted by a layered structure of Ni and Ti thin films.

Furthermore, the separation step is performed by sliding the GaN substrate 101. Thus, the GaN substrate 101 can be securely separated in the vicinity of an interface of the GaN substrate 101.

When a plurality of light-emitting elements (integrated LED) are formed on the support substrate 113 having a convex shape, light can be emitted from the convex shape, thus providing light emitted in a wide range.

The support substrate 113 having a high thermal conductivity can be used as a heat sink. Thus, the adjustment layer 114 can be used as solder adhered with a package system by using soldering material such as Au—Sn for the adjustment layer 114.

When the adjustment layer 114 of the support substrate 113 is a Ti—Ni layer, the warpage level of the support substrate 113 can be adjusted or the mechanical strength can be increased.

SECOND EMBODIMENT

Figure 8A:
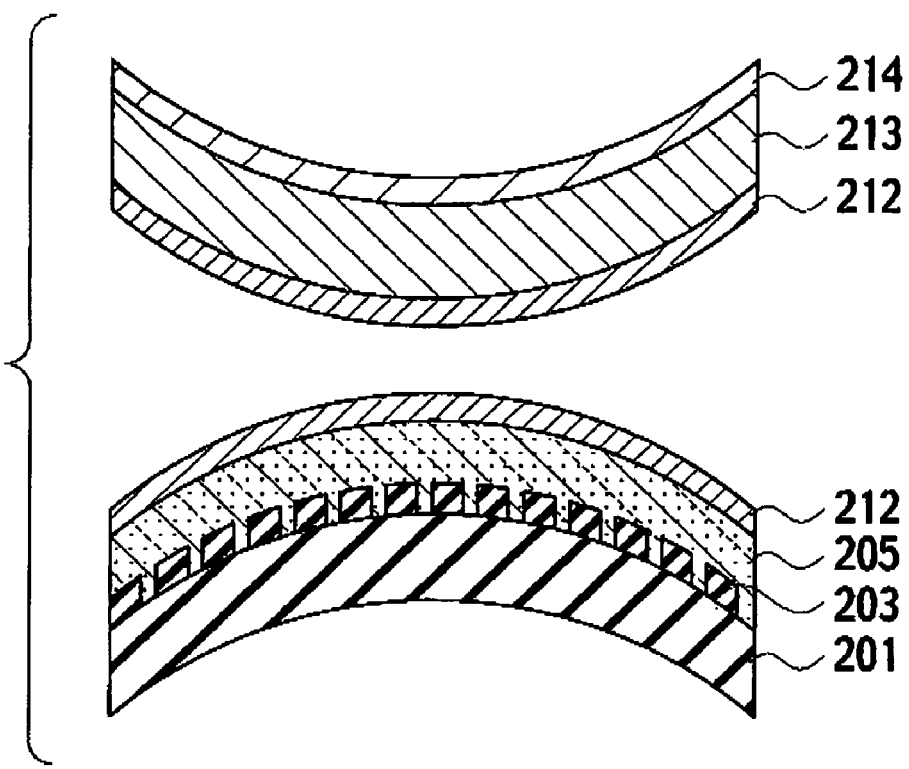
FIGS. 8A and 8B are a cross-sectional view schematically illustrating a nitride-base semiconductor element according to the second embodiment.
Figure 8B:
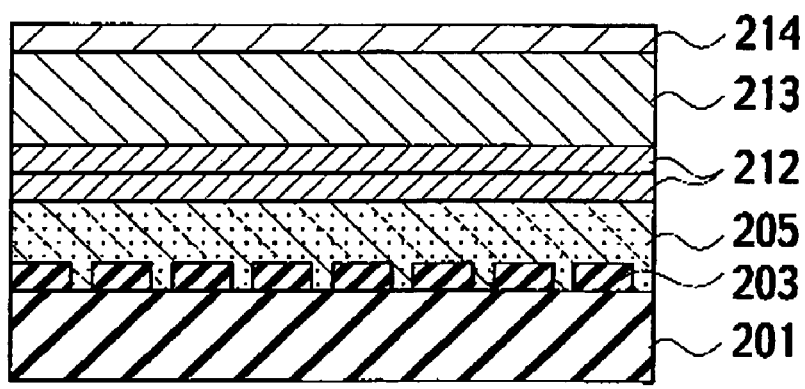

FIG. 8 schematically illustrates a method for manufacturing the nitride-base semiconductor light-emitting diode according to the second embodiment. In the second embodiment, as shown in FIG. 8A, an adjustment layer 214 made of material having a higher thermal expansion coefficient than that of a support substrate 213 is formed on one principal surface of the support substrate 213. Then, a nitride-base semiconductor element layer 205 and the support substrate 213 on a sapphire substrate 201 are joined via an adhesion layer 212. The nitride-base semiconductor element layer 205 includes mask layers 203 having openings with a predetermined interval. By providing the adjustment layer 214 made of material having a higher thermal expansion coefficient than that of the support substrate 213 as described above, the support substrate 213 is convexly curved toward the nitride-base semiconductor element layer 205. The surface of the sapphire substrate 201 on the other hand is convexly curved toward the nitride-base semiconductor element layer 205. Then, as shown in FIG. 8B, the support substrate 213 and the nitride-base semiconductor element layer 205 are joined via the adhesion layer 212.

Next, the method for manufacturing the nitride-base semiconductor light-emitting diode according to the second embodiment will be described in detail with reference to FIGS. 9 to 11.

Figure 9A:
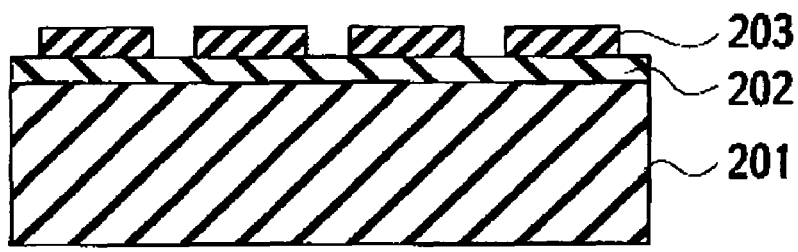
FIGS. 9A, 9B, and 9C are a cross-sectional view for explaining a method for manufacturing the nitride-base semiconductor element according to the second embodiment (No. 1).

First, as shown in FIG. 9A, the Metal Organic Chemical Vapor Deposition (MOCVD) method is used to grow a buffer layer 202 on the (0001) face of the sapphire substrate 201. The buffer layer 202 is made of GaN doped with Si and has a thickness of about 10 to 50 nm.

Next, the mask layers 203 made of dielectric material such as $SiO_2$ are patterned to have stripe geometry and are then grown in the lateral direction from the exposed parts of the buffer layer 202. In this manner, the mask layers 203 having openings with a predetermined interval are formed. This mask layer 203 also may have a structure in which, in order to allow the mask layer 203 to function as a peeling layer in a separation step, a plurality of dielectric material films or metal layers having different thermal expansion coefficients are layered. This mask layer 203 also may have a structure in which a Ti film having a thickness of few nm for example is formed by the electronic beam evaporation or the like to subsequently grow the film again. The details of the mask layer 203 are the same as those in the first embodiment and thus will not be further described.

Figure 9B:
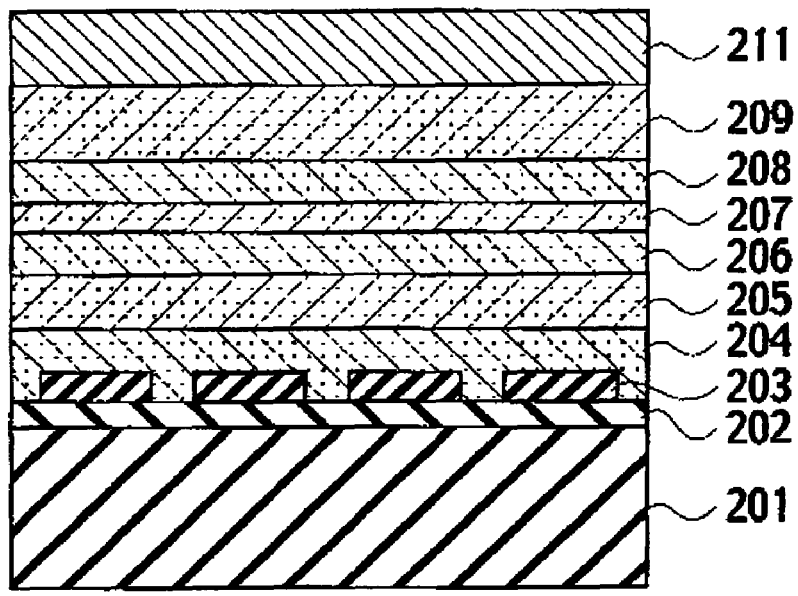

Next, as shown in FIG. 9B, a base layer 204 is grown on the buffer layer 202 and the mask layer 203. The base layer 204 has a thickness of about 5 μm and is made of undoped single crystal GaN. Next, an n-type contact layer 205 is grown on the base layer 204. The n-type contact layer 205 has a thickness of about 5 to 100 μm and is made of single crystal GaN doped with Si. Next, an n-type clad layer 206 is grown on the n-type contact layer 205. The n-type clad layer 206 has a thickness of about 0.15 μm and is made of single crystal $Al_{0.1}Ga_{0.9}N$ doped with Si.

Figure 9C:
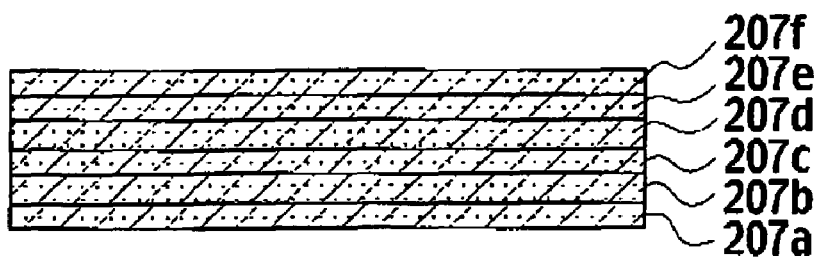

Next, a well layer and a barrier layer are alternately layered on the n-type clad layer 206. The well layer has a thickness of about 5 nm and is made of undoped single crystal $Ga_{0.9}In_{0.1}N$. The barrier layer has a thickness of about 10 nm and is made of undoped single crystal GaN. As a result, an active layer 207 of the MQW structure is grown as shown in FIG. 9C. The active layer 207 has three well layers 207a, 207c, and 207e and three barrier layers 207b, 207d, and 207f.

Next, a p-type cap layer is grown on the active layer 207. The p-type cap layer has a thickness of about 10 nm and is made of single crystal p-type $Al_{0.1}Ga_{0.9}N$ doped with Mg. Next, a p-type clad layer 208 is grown on the p-type cap layer. The p-type clad layer 208 has a thickness of about 0.1 μm and is made of single crystal $Al_{0.1}Ga_{0.9}N$ doped with Mg.

Next, a p-type contact layer 209 is grown on the p-type clad layer 208 by dopant gas consisting of $CP_2Mg$. The p-type contact layer 209 has a thickness of about 5 nm and is made of single crystal $Ga_{0.95}In_{0.05}N$ doped with Mg.

Next, a heat treatment or an electron beam processing is used to make the p-type cap layer, the p-type clad layer 208, and the p-type contact layer 209 as the p-type ones. In this manner, the nitride-base semiconductor element layer is formed that is composed of the buffer layer 202, the base layer 204, the n-type contact layer 205, the n-type clad layer 206, the active layer 207, the p-type cap layer, the p-type clad layer 208, and the p-type contact layer 209. This nitride-base semiconductor element layer has a thickness of 150 μm or less.

Thereafter, a reflective p-side electrode 211 is sequentially formed by the vacuum evaporation method. The reflective p-side electrode 211 consists of: a Pt layer having a thickness of about 1 nm; a Pd layer having a thickness of about 100 nm; an Au layer having a thickness of about 240 nm, and an Ni layer having a thickness of about 240 nm.

Here, the surface of the above-described sapphire substrate 201 is convexly curved toward the nitride-base semiconductor element layer 205.

Figure 10A:
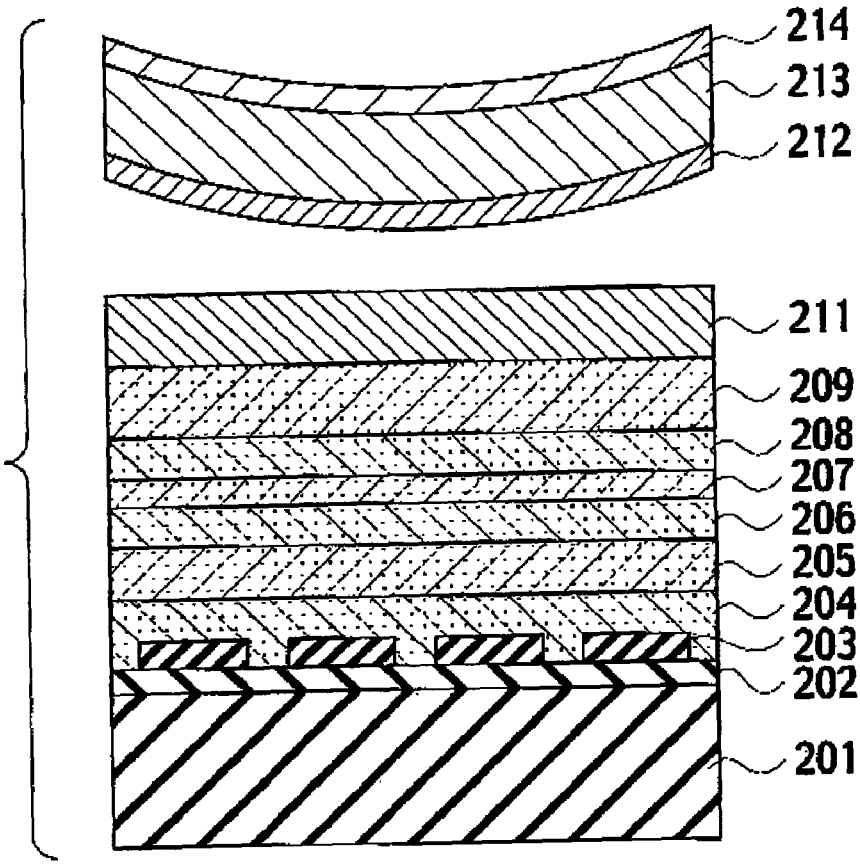
FIGS. 10A and 10B are a cross-sectional view for explaining the method for manufacturing the nitride-base semiconductor element according to the second embodiment (No 2).

On the other hand, as shown in FIG. 10A, the vacuum evaporation method is used to form the adjustment layer 214 on one principal surface of the support substrate 213. The support substrate 213 is made of complex material of Cu and $Cu_2O$ having good thermal conduction and has a thickness of about 200 μm. The adjustment layer 214 is made of Au—Sn (Au: 80 wt %, Sn: 20 wt %). This adjustment layer 214 is made of material having a higher thermal expansion coefficient than that of the support substrate 213. The vacuum evaporation method is used to sequentially form the adhesion layer 212 made of Au—Sn (Au: 80 wt %, Sn: 20 wt %) on the other principal surface of the support substrate 213 via the Ti layer, Pd layer, and Au layer. The adjustment layer 214 is preferably made of material such as Au, Sn, Ni, Ti, or the alloy thereof.

Here, Table 3 shows details of the structures of the support substrate 213, the nitride-base semiconductor element layer, and the sapphire substrate 201. It is assumed that the support substrate 213, the nitride-base semiconductor element layer, and the sapphire substrate 201 are layered in an order shown in Table 3. The terms "warpage shape" represent a shape of the plate when the plate is curved toward the opposed substrate, respectively. The terms "warpage amount" represent the maximum curvature amount for 15 mm.

TABLE 3

|  | Composition | Thickness (μm) | Thermal expansion coefficient $(\times 10^{-6})$ | Warpage shape/warpage amount |
|---|---|---|---|---|
| Support substrate (Cu—$Cu_2O$) | Au—Sn (80:20 wt %) | 8 | 17.5 | Concave shape/ 7.5-13.5 μm |
|  | Ni plating | 3 | 12.8 |  |
|  | Cu—$Cu_2O$ (50:50 wt %) | 200 | 9.5 |  |
|  | Ni plating | 3 | 12.8 |  |
|  | Ti | 0.03 | 8.9 |  |
|  | Pd | 0.1 | 11.8 |  |
|  | Au | 0.2 | 14.1 |  |
|  | Au—Sn (80:20 wt %) | 4 | 17.5 |  |
| Nitride-base semiconductor element layer | Au—Sn (80:20 wt %) | 4 | 17.5 | Convex shape/ 15.0-18.0 μm |
|  | Au | 0.3 | 14.1 |  |
|  | Pd | 0.1 | 11.8 |  |
|  | Ti | 0.2 | 8.9 |  |
|  | GaN (axis a) | 30 | 5.59 |  |
| Sapphire substrate | Sapphire (axis a) | 350 | 7.5 |  |

As shown in FIG. 6A, the adjustment layer made of material having a higher thermal expansion coefficient than that of the support substrate 113 (e.g., metal) may be provided on one principal surface of the support substrate 113, as in the case of the first embodiment. As shown in FIG. 6B, the adjustment layer 114 also may be provided by the same kind of material as that for the adhesion layer 112 and the adjustment layer 114 may have a higher thickness than that of the adhesion layer 112. In this manner, as shown in FIG. 6C, the support substrate 113 is convexly curved toward the nitride-base semiconductor element layer.

Figure 10B:
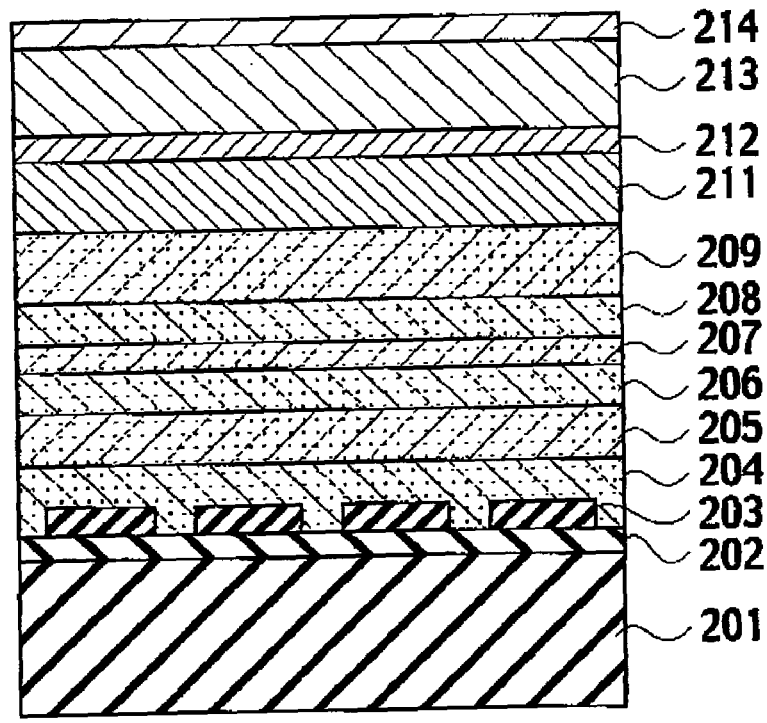

Next, as shown in FIG. 10B, the p-side electrode 211 on the nitride-base semiconductor element layer and the adhesion layer 212 on the support substrate 213 are thermocompressed. The thermocompression is performed in vacuum for about 15 minutes with about 200 to 300 degrees centigrade for example.

Here, the warpage of the joined substrate is smaller than that before the joint and both substrates are joined via the adhesion layer 112 to apply a tensile stress to the support substrate 213.

Figure 11A:
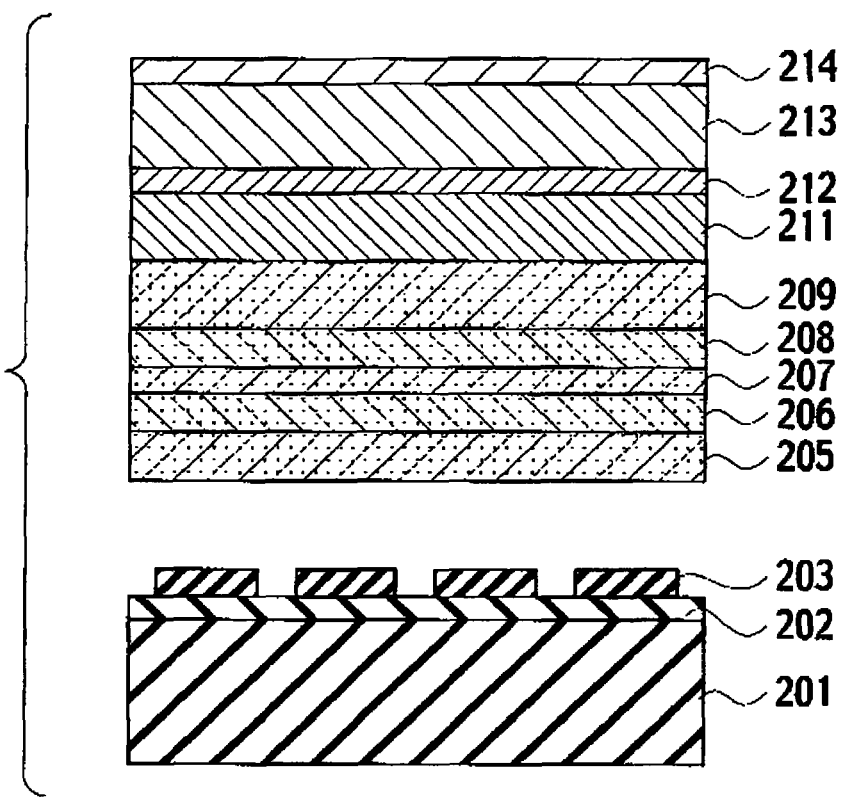
FIGS. 11A and 11B are a cross-sectional view for explaining the method for manufacturing the nitride-base semiconductor element according to the second embodiment (No. 3).

Next, as shown in FIG. 11A, by applying stress to the sapphire substrate 201, the sapphire substrate 201 is separated from the nitride-base semiconductor element layer joined with the support substrate 213. A method of applying stress may be, for example, such a method that the joined support substrate 213 is fixed and a jig is abutted to a back side or a lateral side of the sapphire substrate 201 for providing a sliding movement to separate the substrate. The sliding direction may be a horizontal or vertical direction to the principal surface of the sapphire substrate 201. Furthermore, the heat treatment is performed with a temperature similar to that used in the thermocompression, thereby providing an easy separation.

Next, the n-type contact layer 205 is exposed by polishing or etching.

Figure 11B:
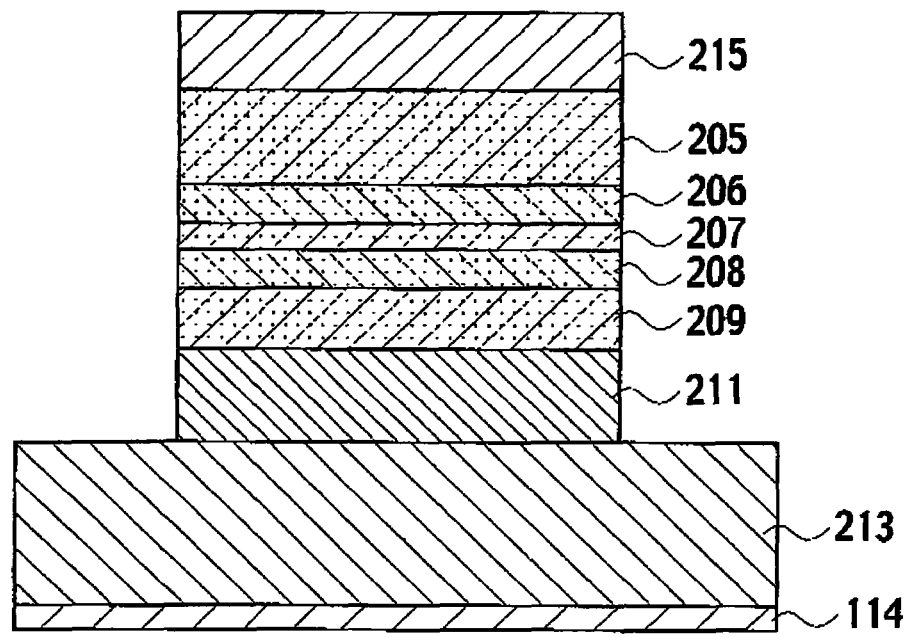

Next, as shown in FIG. 11B, the vacuum evaporation method is used to form an n-side ohmic electrode at a predetermined region on the n-type contact layer 205. The n-side ohmic electrode is composed of: an Al layer having a thickness of about 6 nm; an Si layer having a thickness of about 2 nm; an Ni layer having a thickness of about 10 nm; and an Au layer having a thickness of about 700 nm. Then, an n-side electrode 215 is formed on the n-side ohmic electrode.

Then, the element is separated by dicing, laser scribing, or a selective etching of the support substrate 213. In this manner, the nitride-base semiconductor element according to the second embodiment is provided.

According to the method for manufacturing the nitride-base semiconductor element of the second embodiment and the nitride-base semiconductor element, the adjustment layer 214 is made of material having a higher thermal expansion coefficient than that of the support substrate 213, thus providing a property to the support substrate 213 by which the support substrate 213 is convexly curved toward the nitride-base semiconductor element layer. Thus, the sapphire substrate 201 can be separated easily and securely. Thus, deterioration of the crystal performance due to the dislocation of the lattice from that of the sapphire substrate 201 can be solved and thus the electric and optical characteristic can be improved.

By separating the sapphire substrate having a low thermal conductivity, an element structure can be obtained in which p-side and n-side electrodes are provided at upper and lower position of the respective chips, thereby significantly improving the radiation characteristic. In addition, the increased contact area can reduce the element resistance to provide high power operation. The current flowing in the upper and lower direction of a chip also can reduce the size of the chip to uniformize the current density to prevent concentrated current, thereby improving the reliability.

Furthermore, the sapphire substrate 201 has small damage by the separation and thus can be reused as a growth substrate. Thus, the sapphire substrate 201 can be provided with a low cost. The sapphire substrate also does not require laser irradiation when being separated and thus a further economic effect can be expected.

The existence of the mask layers 203 having openings with a predetermined interval also provides an easy separation of the sapphire substrate 201 in the vicinity of an interface of the mask layer 203. Furthermore, the mask layer 203 is formed to have a structure in which a plurality of thin films having different thermal expansion coefficients (e.g., Ti, Si) are layered. Thus, the sapphire substrate 201 can be separated in a further easy manner by being suddenly heated or cooled by Rapid Thermal Anneal (RTA) for example.

The curvature amount of the adjustment layer 214 can be adjusted by adjusting the metal film material, the layering, or the thickness depending on the type of the support substrate 213. The curvature amount also can be effectively adjusted by a layered structure of Ni and Ti thin films.

OTHER EMBODIMENTS

The present invention has been described according to the foregoing first to second embodiments. However, it should be understood that the description and drawings, which partially constitute the present disclosure, do not limit this invention. From this disclosure, various alternative embodiments, embodiments and operational technologies will become apparent to those skilled in the art.

For example, although the first and second embodiments have mainly illustrated the method for manufacturing a light-emitting diode and a semiconductor laser that use light emitted from an active layer of a nitride semiconductor element layer, the present invention is not limited to this. The present invention also can be applied to the manufacture of a light-emitting element combined with phosphor that uses light emitted from these light-emitting elements as excitation light. The present invention also can be applied to an electronic device having a nitride-base semiconductor element layer (e.g., High Electron Mobility Transistor (HEMT)), a Surface Acoustic Wave (SAW) device, and a light-receiving element. The technique according to the present invention for replacing a substrate also can be applied to a multiwavelength semiconductor laser. Thus, a defect rate of an interval of light-emitting points in a wafer surface in multiwavelength laser can be improved.

Although the first and second embodiments have described an example in which the MOCVD method is used to provide crystal grow of the respective layers of a nitride semiconductor, the present invention is not limited to this. Thus, the crystal grow of the respective layers of a nitride semiconductor also may be provided by the HVPE method or the gas source MBE method. The crystal structure of the nitride-base compound semiconductor also may be the wurtzite structure or the zinc blende structure. Furthermore, the plain orientation in the growth is not limited to (0001) and also may be (11-20) or (1-100).

Furthermore, although the first and second embodiments have used the nitride-base semiconductor element layer including a layer made of GaN, AlGaN, InGaN, and AlN for example, the present invention is not limited to this. Thus, the nitride-base semiconductor element layer including a layer other than a layer made of GaN, AlGaN, InGaN, and AlN also may be used. The semiconductor element layer also may have a shape having a current stricture structure (e.g., mesa structure, ridge structure).

Furthermore, although the first and second embodiments have used the GaN substrate and the sapphire substrate as a growth substrate for the nitride-base semiconductor element layer, the present invention is not limited to this. The present invention can use a substrate on which the nitride-base semiconductor can be grown, including spinel, MgO, ZnO, LaO, GaO, Si, GaAs, and SiC for example.

The support substrate is preferably made of conductive material. In addition to the complex material of metal and metal oxide used in the first and second embodiments, conductive semiconductor (e.g., Si, SiC, GaAs, ZnO) or metal or complex metal (e.g., Al, Fe—Ni, Cu—W, CU—Mo) can be used. Generally, metal-base material has a superior mechanical characteristic than that of semiconductor material and is more resistant to crack than semiconductor material and thus is suitable as material for a support substrate. More preferable material is material having a high conductivity and a high mechanical strength that is obtained by combining highly conductive metal (e.g., Cu, Ag, Au) with metal or metal oxide having a high hardness (e.g., W, Mo, Ni, CuO). In this case, Cu—$Cu_2O$ (Cu: 50 wt %, $Cu_2O$: 50 wt %), Cu—W (Cu: 50 wt %, W: 50 wt %), and Cu—Mo (Cu: 50 wt %, Mo: 50 wt %) have thermal expansion coefficients of $10 \times 10^{-6}$/K, $7 \times 10^{-6}$/K, and $7 \times 10^{-6}$/K, respectively. Materials for the adjustment layer having a high thermal expansion coefficient to these substrate materials include, for example, Ni, Au, Cu, An—Sn, Ag, and Al.

Various modifications will become possible for those skilled in the art after receiving the teachings of the present disclosure without departing from the scope thereof

What is claimed is:

1. A method for manufacturing a nitride-base semiconductor device, comprising:
   forming, on a first substrate, a nitride-base semiconductor device layer having at least one layer;
   forming, on one principal surface of a second substrate, an adjustment layer made of material having a higher thermal expansion coefficient than that of the second substrate, thereby curving the second substrate concavely at the side of the one principal surface on which the adjustment layer is formed;
   joining the first substrate and the second substrate via an adhesion layer, thereby arranging the first substrate, the nitride-base semiconductor device layer, the adhesion layer, the second substrate, and the adjustment layer in this order; and,
   separating the first substrate from the joined nitride-base semiconductor device layer and the second substrate.

2. The method for manufacturing a nitride-base semiconductor device according to claim 1,
   wherein the adjustment layer is made of the same kind of metal as that of the adhesion layer and the adjustment layer has a thickness larger than the thickness of the adhesion layer.

3. The method for manufacturing a nitride-base semiconductor device according to claim 1,
   wherein the second substrate includes compound material of metal and oxide of the metal as a main component and the adjustment layer is made of gold, tin, nickel, titanium, or the alloy of them.

4. The method for manufacturing a nitride-base semiconductor device according to claim 1,
   wherein the nitride-base semiconductor device layer includes mask layers having openings with a predetermined interval.

5. The method for manufacturing a nitride-base semiconductor device according to claim 4,
   wherein the mask layer is formed by layering a plurality of films having different thermal expansion coefficients.

6. The method for manufacturing a nitride-base semiconductor device according to claim 1,
   wherein one end of the nitride-base semiconductor device layer includes a first electrode and the other end of the nitride-base semiconductor device layer includes a second electrode.

7. The method for manufacturing a nitride-base semiconductor device according to claim 1,
   wherein the separating is performed by slide movement of the first substrate.

8. A nitride-base semiconductor device that is manufactured by:
   forming, on a first substrate, a nitride-base semiconductor device layer having at least one layer, thereby curving the second substrate concavely at the side of the one principal surface on which the adjustment layer is formed;
   joining the first substrate and the second substrate via an adhesion layer, thereby arranging the first substrate, the nitride-base semiconductor device layer, the adhesion layer, the second substrate, and the adjustment layer in this order; and
   separating the first substrate from the joined nitride-base semiconductor device layer and the second substrate,
   wherein the nitride-base semiconductor device comprises:
   an adjustment layer that is provided on an opposite surface of the second substrate and that is made of material having a different thermal expansion coefficient from flint of the second substrate.

9. The method for manufacturing a nitride-base semiconductor device according to claim 1,
   wherein the separating further comprises fixing the first substrate that is joined to the second substrate, abutting a jig to the back or lateral side of the first substrate for providing a sliding movement to separate the first substrate.

10. The method for manufacturing a nitride-base semiconductor device according to claim 1,
    wherein the separating further comprises a heat treatment.

11. The method for manufacturing a nitride-base semiconductor device according to claim 10,
    wherein the heat treatment is carried out by rapid thermal annealing.

12. The nitride-base semiconductor device according to claim 8,
    wherein the separating further comprises performing at least a sliding movement between the first substrate and the second substrate or a heat treatment.

13. A method for manufacturing a nitride-base semiconductor device, comprising:
    forming, on a recyclable first substrate, a nitride-base semiconductor device layer having at least one layer,
    forming, on one principal surface of a second substrate, an adjustment layer made of material having a higher thermal expansion coefficient than that of the second substrate, thereby curving the second substrate concavely at the side of the one principal surface on which the adjustment layer is formed;
    joining the first substrate and the second substrate via an adhesion layer, thereby arranging the first substrate, the nitride-base semiconductor device layer, the adhesion layer, the second substrate, and the adjustment layer in this order; and
    separating the first recyclable first substrate from the joined nitride-base semiconductor device layer and the second substrate.

14. The method for manufacturing a nitride-base semiconductor device according to claim 13,
wherein the separating further comprises performing at least a sliding movement between a recyclable first substrate and the second substrate or by a heat treatment.

15. The method for manufacturing a nitride-base semiconductor device according to claim 13,
wherein the recyclable first substrate is a GaN substrate or a sapphire substrate.

16. The method for manufacturing a nitride-base semiconductor device according to claim 13,
wherein the recyclable first substrate comprises at least one of spinel, MgO, ZnO, LaO, GaO, Si, GaAs, and SiC.

17. The method for manufacturing a nitride-base semiconductor device according to claim 13,
wherein laser irradiation is not used in the separating.

18. The method for manufacturing a nitride-base semiconductor device according to claim 1, further comprising:
forming, between the first substrate and the second substrate, mask layers made of a plurality of films having different thermal expansion coefficients;
wherein the separating is performed by peeling one or more films of the mask layers from the others.

19. The method for manufacturing a nitride-base semiconductor device according to claim 1,
wherein the curving of the second substrate convexly toward the nitride-base semiconductor device layer occurs via a change in temperature.

20. The method for manufacturing a nitride-base semiconductor device according to claim 19,
wherein the change in temperature is a decrease in temperature.

* * * * *